United States Patent
Lu et al.

(10) Patent No.: US 12,334,131 B2
(45) Date of Patent: Jun. 17, 2025

(54) ADAPTIVE WORDLINE REFRESH

(71) Applicant: Micron Technology, Inc., Boise, ID (US)

(72) Inventors: Yang Lu, Boise, ID (US); Kang-Yong Kim, Boise, ID (US)

(73) Assignee: Micron Technology, Inc., Boise, ID (US)

(*) Notice: Subject to any disclaimer, the term of this patent is extended or adjusted under 35 U.S.C. 154(b) by 540 days.

(21) Appl. No.: 17/656,801

(22) Filed: Mar. 28, 2022

(65) Prior Publication Data
US 2023/0307030 A1 Sep. 28, 2023

(51) Int. Cl.
*G11C 11/406* (2006.01)
*G11C 11/4076* (2006.01)
*G11C 11/408* (2006.01)

(52) U.S. Cl.
CPC .. *G11C 11/40615* (2013.01); *G11C 11/40622* (2013.01); *G11C 11/4076* (2013.01); *G11C 11/4085* (2013.01); *G11C 11/40618* (2013.01)

(58) Field of Classification Search
CPC ........ G11C 11/40615; G11C 11/40622; G11C 11/4076; G11C 11/4085; G11C 11/40618; G11C 11/40607; G11C 11/406; G11C 11/4063
See application file for complete search history.

(56) References Cited

U.S. PATENT DOCUMENTS

| | | | | |
|---|---|---|---|---|
| 5,301,292 A * | 4/1994 | Hilton | ................ | G06F 12/0215 |
| | | | | 711/E12.004 |
| 5,495,448 A * | 2/1996 | Sachdev | ................ | G11C 29/34 |
| | | | | 365/194 |
| 5,973,988 A * | 10/1999 | Nakahira | ............ | G11C 7/1045 |
| | | | | 365/189.08 |
| 2012/0151131 A1* | 6/2012 | Kilmer | ................ | G11C 11/406 |
| | | | | 711/E12.001 |
| 2014/0177771 A1* | 6/2014 | Maruko | ................ | H04L 7/0337 |
| | | | | 375/375 |
| 2021/0081312 A1* | 3/2021 | Coury | ................ | G06F 12/0813 |

* cited by examiner

*Primary Examiner* — Jay W. Radke
(74) *Attorney, Agent, or Firm* — Colby Nipper PLLC

(57) ABSTRACT

Described apparatuses and methods relate to adaptive wordline refresh for a memory system that may support a nondeterministic protocol. To help manage power delivery networks in a memory system, a memory device can include logic that can stagger activation of multiple wordlines that are to be activated or refreshed approximately simultaneously. The logic circuitry can be coupled between wordlines that are to be activated and delay propagation of the activation signal. Thus, a first group of wordlines (e.g., "before" the logic circuitry) are activated by the signal, but activation of a second group of wordlines (e.g., "after" the logic circuitry), is delayed, reducing the peak current draw. Additional logic circuitries can be coupled between the wordlines to divide the wordlines into multiple groups, thereby staggering the activation of wordlines that are activated by a refresh command, which can reduce the peak current draw and power consumption.

36 Claims, 9 Drawing Sheets

ADAPTIVE WORDLINE REFRESH

BACKGROUND

Computers, smartphones, and other electronic devices rely on processors and memories. A processor executes code based on data to run applications and provide features to a user. The processor obtains the code and the data from a memory. The memory in an electronic device can include volatile memory (e.g., random-access memory (RAM)) and nonvolatile memory (e.g., flash memory). Like the number of cores or speed of a processor, the rate at which data can be accessed, and the delays in accessing it, can impact an electronic device's performance. This impact on performance increases as processors are developed that execute code faster and as applications on electronic devices operate on ever-larger data sets that require ever-larger memories.

BRIEF DESCRIPTION OF THE DRAWINGS

Apparatuses of and techniques for adaptive wordline refresh are described with reference to the following drawings. The same numbers are used throughout the drawings to reference like features and components:

FIG. 5-1 illustrates a portion of an example memory system that can implement aspects of adaptive wordline refresh;

FIG. 5-2 illustrates an example implementation of a logic circuit that can implement aspects of adaptive wordline refresh with a memory device;

DETAILED DESCRIPTION

Overview

Figure 1:
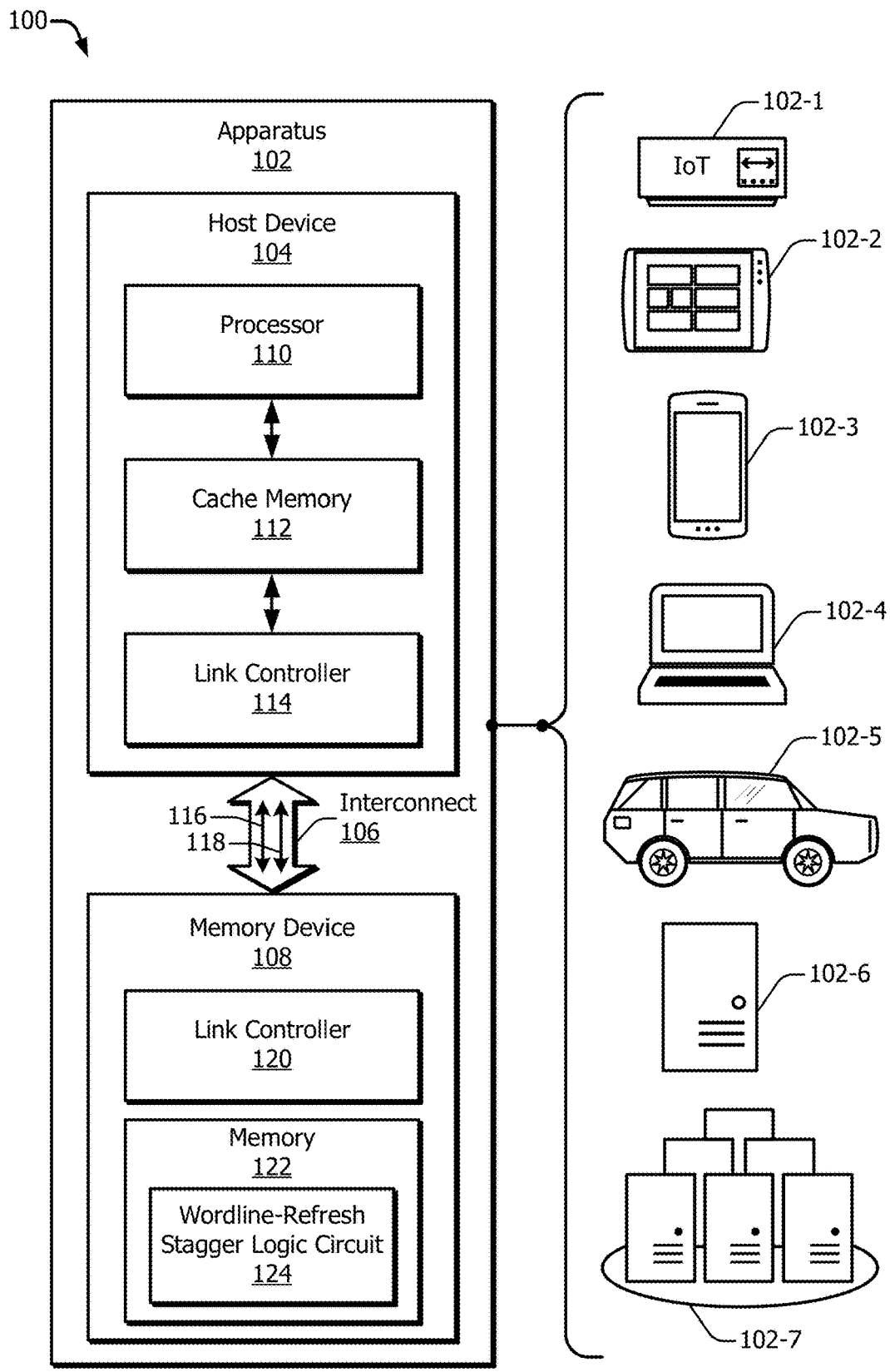
FIG. 1 illustrates example apparatuses that can implement adaptive wordline refresh.

Processors and memory work in tandem to provide features on computers and other electronic devices, including smartphones. An electronic device can generally provide enhanced features, such as high-resolution graphics and artificial intelligence, as a processor-and-memory tandem operate faster. Some applications, like those for artificial intelligence and virtual-reality graphics, demand increasing amounts of memory. Advances in processors have often outpaced those for memories or the connections between the processor and memory.

Processors and memories can be secured to a printed circuit board (PCB), such as a motherboard. The PCB can include sockets for accepting at least one processor and one or more memories and various wiring infrastructure that enable communication between two or more components. The PCB, however, offers a finite area for the sockets and the wiring infrastructure. Some PCBs include sockets that are shaped into linear slots and are designed to accept multiple double-inline memory modules (DIMMs). These sockets can be fully occupied by DIMMs while a processor is still able to utilize more memory. In such situations, the system can have improved performance if more memory were available.

Printed circuit boards may also include at least one peripheral component interconnect (PCI) express (PCI Express®) (PCIe) slot. PCIe is designed to provide a common interface for various types of components that may be coupled to a PCB. Compared to some older standards, PCIe can provide higher rates of data transfer or a smaller footprint on the PCB, including both greater speed and smaller size. PCIe links enable interconnection of processors and peripheral memory devices at increased speeds compared to older standards. Accordingly, some PCBs enable a processor to access a memory device that is connected to the PCB via a PCIe slot.

PCIe links, however, have limitations in an environment with large, shared memory pools and devices that require high bandwidth and low latency. For example, PCIe links do not specify mechanisms to support coherency and often cannot efficiently manage isolated pools of memory. In addition, the latency for PCIe links can be too high to efficiently manage shared memory access across multiple devices within a system.

As a result, accessing a memory solely using a PCIe protocol may not offer as much functionality, flexibility, or reliability as is desired. In such cases, another protocol can be layered on top of the PCIe protocol. An example of another, higher-level protocol is the Compute Express Link (CXL) protocol or standard (referred to hereinafter as "the CXL protocol" or "the CXL standard"). The CXL protocol can be implemented over a physical layer that is governed by, for instance, the PCIe protocol. The CXL protocol targets intensive workloads for processors and memory devices (e.g., accelerators, memory expanders), where efficient, coherent memory access or interactions between processors and memory is beneficial. The CXL protocol addresses some of the limitations of PCIe links by providing an interface that leverages the PCIe 5.0 physical layer and electricals, while providing lower-latency paths for memory access and coherent caching between processors and memory devices. It offers high-bandwidth, low-latency connectivity between host devices (e.g., processors, CPUs, SoCs) and memory devices (e.g., accelerators, memory expenders, memory buffers, smart input/output (I/O) devices). The CXL protocol also addresses growing high-performance computational workloads by supporting heterogeneous processing and memory systems with potential applications in artificial intelligence, machine learning, communication systems, and other high-performance computing.

Various electronic devices, such as a mobile phone with a system-on-chip (SoC) or a cloud-computing server with dozens of processing units, may employ memory that is coupled to a processor via a CXL-based interconnect (which can be referred to as a "CXL link" in this document). For clarity, consider an apparatus with a host device that is coupled to a memory device via a CXL link. The host device can include a processor and a controller (e.g., a host-side controller) that is coupled to the interconnect. The memory device can include another controller (e.g., a memory-side controller) that is coupled to the interconnect and one or more memory arrays to store information in static RAM (SRAM), dynamic RAM (DRAM), flash memory, and so forth.

While the CXL protocol can help address the issue of the higher latency of PCIe links, using CXL can also lead to challenges related to power consumption when used with some types of memory. For example, volatile memory, including double data rate synchronous dynamic random-access memory (DDR SDRAM) and low-power DDR (LPDDR), is made in part from capacitors, from which the charge slowly drains over time. Data stored in memory cells of volatile memory may be lost if the capacitor is not recharged. Therefore, to maintain an appropriate charge, the memory cells are periodically refreshed. To perform a refresh operation, the memory reads data from a memory cell corresponding to a refresh address into a temporary storage (e.g., a sense amp) and then writes the data back to the memory cell with the proper charge. A refresh address can include memory cell addresses, row addresses, bank addresses, and the like.

Refresh operations can consume relatively large amounts of power. During a refresh operation, multiple wordlines per bank can be activated at approximately the same time in order to refresh the entire memory array often enough to maintain performance and data-integrity metrics (e.g., as defined in a specification such as a Joint Electron Device Engineering Council (JEDEC) standard). Activating a wordline refreshes the row served by the wordline and causes a current peak. The larger the page (e.g., row) size, the higher the peak current will be. During a typical refresh for a DRAM component, two or four wordlines per bank are activated at the same time (e.g., per command) with a 1-2 kilobyte (KB) page size. Thus, the total page size is 2-8 KB.

This process becomes more difficult when designing volatile memory (e.g., DRAM) for use with CXL devices. The page size may be similar to the higher end of current memory page sizes (e.g., 2.25 KB), but because of other factors (e.g., higher density, larger die sizes, refresh timing requirements, data-retention requirements), volatile memory used with CXL devices often refresh more wordlines per bank at one time (e.g., eight or more wordlines at a time). This can bring the total page size closer to 18 KB, which means the peak current can be between nearly three and nine times higher with CXL devices. The higher peak current can make designing the local power delivery network (PDN) more complex and increase the cost of the PDN (e.g., more metal layers, capacitors). Further, while there may be some solutions that can help reduce overall peak current (e.g., at the die or module level), those techniques do not generally reduce peak current at the local bank level.

To improve performance of a CXL system, this document describes example approaches that can be used to implement adaptive wordline refresh. Logic circuitry can be added to a memory array to stagger activation of multiple wordlines that are to be activated or refreshed (e.g., multiple wordlines that are to be activated approximately simultaneously). Consider an example system in which the logic circuitry is coupled between the wordlines that are to be activated by a refresh command. The logic circuitry delays propagation of the refresh command when the adaptive wordline refresh is enabled. Thus, a first group of wordlines (e.g., "before" the logic circuitry) are activated by the refresh command. However, activation of a second group of wordlines (e.g., "after" the logic circuitry) is delayed, reducing the peak current draw. Additional logic circuitries can be coupled between the wordlines to divide the wordlines into multiple groups, thereby staggering the activation of wordlines that are activated by a refresh command and reducing the peak current draw and power consumption.

By employing one or more of these implementations, peak power consumption (e.g., peak current draw) at the bank (local) level can be reduced. This can make it easier to meet refresh timing and memory retention targets in higher density memory. Further, reducing the peak current can reduce the requirements for metal layers and other components in the local PDN, which can reduce cost. Reducing the peak current can also reduce the system-level peak current, making system-level PDN design less complex. Additionally, adaptive wordline refresh can reduce costs for the power-management integrated circuit (PMIC) by reducing peak power demands for the system. Delaying propagation of the refresh command can increase system latency by increasing the time it takes to refresh an entire wordline (e.g., "tRFC") by the delay time. Reducing power consumption, however, allows memory designers and engineers to make design tradeoffs between PDN parameters or limitations and overall memory latency, which can enable solutions for different customers and product-design parameters.

Example Operating Environments

FIG. 1 illustrates, at 100 generally, an example apparatus 102 that can implement adaptive wordline refresh. The apparatus 102 can include various types of electronic devices, including an internet-of-things (IoT) device 102-1, tablet device 102-2, smartphone 102-3, notebook computer 102-4, passenger vehicle 102-5, server computer 102-6, and server cluster 102-7 that may be part of cloud computing infrastructure or a data center or a portion thereof (e.g., a printed circuit board (PCB)). Other examples of the apparatus 102 include a wearable device (e.g., a smartwatch or intelligent glasses), entertainment device (e.g., a set-top box, video dongle, smart television, a gaming device), desktop computer, motherboard, server blade, consumer appliance, vehicle, drone, industrial equipment, security device, sensor, or the electronic components thereof. Each type of apparatus can include one or more components to provide computing functionalities or features.

In example implementations, the apparatus 102 can include at least one host device 104, at least one interconnect 106, and at least one memory device 108. The host device 104 can include at least one processor 110, at least one cache memory 112, and a link controller 114. The memory device 108, which can be also be a memory module, can include, for example, a dynamic random-access memory (DRAM) die or module (e.g., Low-Power Double Data Rate synchronous DRAM (LPDDR SDRAM)). The DRAM die or module can include a three-dimensional (3D) stacked DRAM device, which may be a high-bandwidth memory (HBM) device or a hybrid memory cube (HMC) device. The memory device 108 can operate as a main memory for the apparatus 102. Although not illustrated, the apparatus 102 can also include storage memory. The storage memory can include, for example, a storage-class memory device (e.g., a flash memory, hard disk drive, solid-state drive, phase-change memory (PCM), or memory employing 3D XPoint™).

The processor 110 is operatively coupled to the cache memory 112, which is operatively coupled to the link controller 114. The processor 110 is also coupled, directly or indirectly, to the link controller 114. The host device 104 may include other components to form, for instance, a system-on-a-chip (SoC). The processor 110 may include a general-purpose processor, central processing unit (CPU), graphics processing unit (GPU), neural network engine or accelerator, application-specific integrated circuit (ASIC), field-programmable gate array (FPGA) integrated circuit (IC), or communications processor (e.g., a modem or baseband processor).

In operation, the link controller 114 can provide a high-level or logical interface between the processor 110 and at least one memory (e.g., an external memory). The link controller 114 can, for example, receive memory requests from the processor 110 and provide the memory requests to external memory with appropriate formatting, timing, and reordering. The link controller 114 can also forward to the processor 110 responses to the memory requests received from external memory.

The host device 104 is operatively coupled, via the interconnect 106, to the memory device 108. In some examples, the memory device 108 is connected to the host device 104 via the interconnect 106 with an intervening buffer or cache. The memory device 108 may operatively couple to storage memory (not shown). The host device 104 can also be coupled, directly or indirectly via the interconnect 106, to the memory device 108 and the storage memory. The interconnect 106 and other interconnects (not illustrated in FIG. 1) can transfer data between two or more components of the apparatus 102. Examples of the interconnect 106 include a bus, switching fabric, or one or more wires that carry voltage or current signals.

The interconnect 106 can include at least one command and address bus 116 (CA bus 116) and at least one data bus 118 (DQ bus 118). Each bus may be a unidirectional or a bidirectional bus. The CA bus 116 and the DQ bus 118 may couple to CA and DQ pins, respectively, of the memory device 108. In some implementations, the interconnect 106 may also include a chip-select (CS) I/O (not illustrated in FIG. 1) that can, for example, couple to one or more CS pins of the memory device 108. The interconnect 106 may also include a clock bus (CK bus—not illustrated in FIG. 1) that is part of or separate from the CA bus 116.

The interconnect 106 can be a CXL link. In other words, the interconnect 106 can comport with at least one CXL standard or protocol. The CXL link can provide an interface on top of the physical layer and electricals of the PCIe 5.0 physical layer. The CXL link can cause requests to and responses from the memory device 108 to be packaged as flits. An example implementation of the apparatus 102 with a CXL link is discussed in greater detail with respect to FIG. 4. In other implementations, the interconnect 106 can be another type of link, including a PCIe 5.0 link. In this document, some terminology may draw from one or more of these standards or versions thereof, like the CXL standard, for clarity. The described principles, however, are also applicable to memories and systems that comport with other standards and interconnects.

The illustrated components of the apparatus 102 represent an example architecture with a hierarchical memory system. A hierarchical memory system may include memories at different levels, with each level having memory with a different speed or capacity. As illustrated, the cache memory 112 logically couples the processor 110 to the memory device 108. In the illustrated implementation, the cache memory 112 is at a higher level than the memory device 108. A storage memory, in turn, can be at a lower level than the main memory (e.g., the memory device 108). Memory at lower hierarchical levels may have a decreased speed but increased capacity relative to memory at higher hierarchical levels.

The apparatus 102 can be implemented in various manners with more, fewer, or different components. For example, the host device 104 may include multiple cache memories (e.g., including multiple levels of cache memory) or no cache memory. In other implementations, the host device 104 may omit the processor 110 or the link controller 114. A memory (e.g., the memory device 108) may have an "internal" or "local" cache memory. As another example, the apparatus 102 may include cache memory between the interconnect 106 and the memory device 108. Computer engineers can also include the illustrated components in distributed or shared memory systems.

Computer engineers may implement the host device 104 and the various memories in multiple manners. In some cases, the host device 104 and the memory device 108 can be disposed on, or physically supported by, a PCB (e.g., a rigid or flexible motherboard). The host device 104 and the memory device 108 may additionally be integrated on an IC or fabricated on separate ICs packaged together. The memory device 108 may also be coupled to multiple host devices 104 via one or more interconnects 106 and may respond to memory requests from two or more host devices 104. Each host device 104 may include a respective link controller 114, or the multiple host devices 104 may share a link controller 114. This document describes an example computing system architecture with at least one host device 104 coupled to the memory device 108 with reference to FIG. 2.

Two or more memory components (e.g., modules, dies, banks, bank groups, or ranks) can share the electrical paths or couplings of the interconnect 106. In some implementations, the CA bus 116 transmits addresses and commands from the link controller 114 to the memory device 108, which may exclude propagating data. The DQ bus 118 can propagate data between the link controller 114 and the memory device 108. The memory device 108 can also include a link controller 120 that is similar to the link controller 114 of the host device 104. The link controllers 114 and 120 can, for example, package and unpackage requests and responses in the appropriate format (e.g., as a flit) for transmission over the interconnect 106. The memory device 108 includes memory 122, which may include multiple memory banks (not illustrated in FIG. 1). The memory device 108 may also be implemented as any suitable memory including, but not limited to, DRAM, SDRAM, three-dimensional (3D) stacked DRAM, DDR memory, or LPDDR memory (e.g., LPDDR DRAM or LPDDR SDRAM).

The memory device 108 can form at least part of the main memory of the apparatus 102. The memory device 108 may, however, form at least part of a cache memory, a storage memory, or an SoC of the apparatus 102. In some implementations, the memory device 108 can include a wordline-refresh stagger logic circuit 124 (logic circuit 124) that can implement adaptive wordline refresh. For example, the logic circuit 124 can be incorporated at the memory 122 or at another functional position between the interconnect 106 and the memory 122. In some implementations, multiple rows of a memory array (e.g., a memory array included in a DRAM module, bank, or die) can be divided into groups. The logic circuit 124 can be coupled between the groups of wordlines and used to delay or stagger refresh operations at the wordline level to reduce peak power draw during the refresh operations, as described in more detail with reference to FIGS. 2-8. The structure and operation of the logic circuit 124 are discussed in greater detail with respect to FIGS. 2-8.

Figure 2:
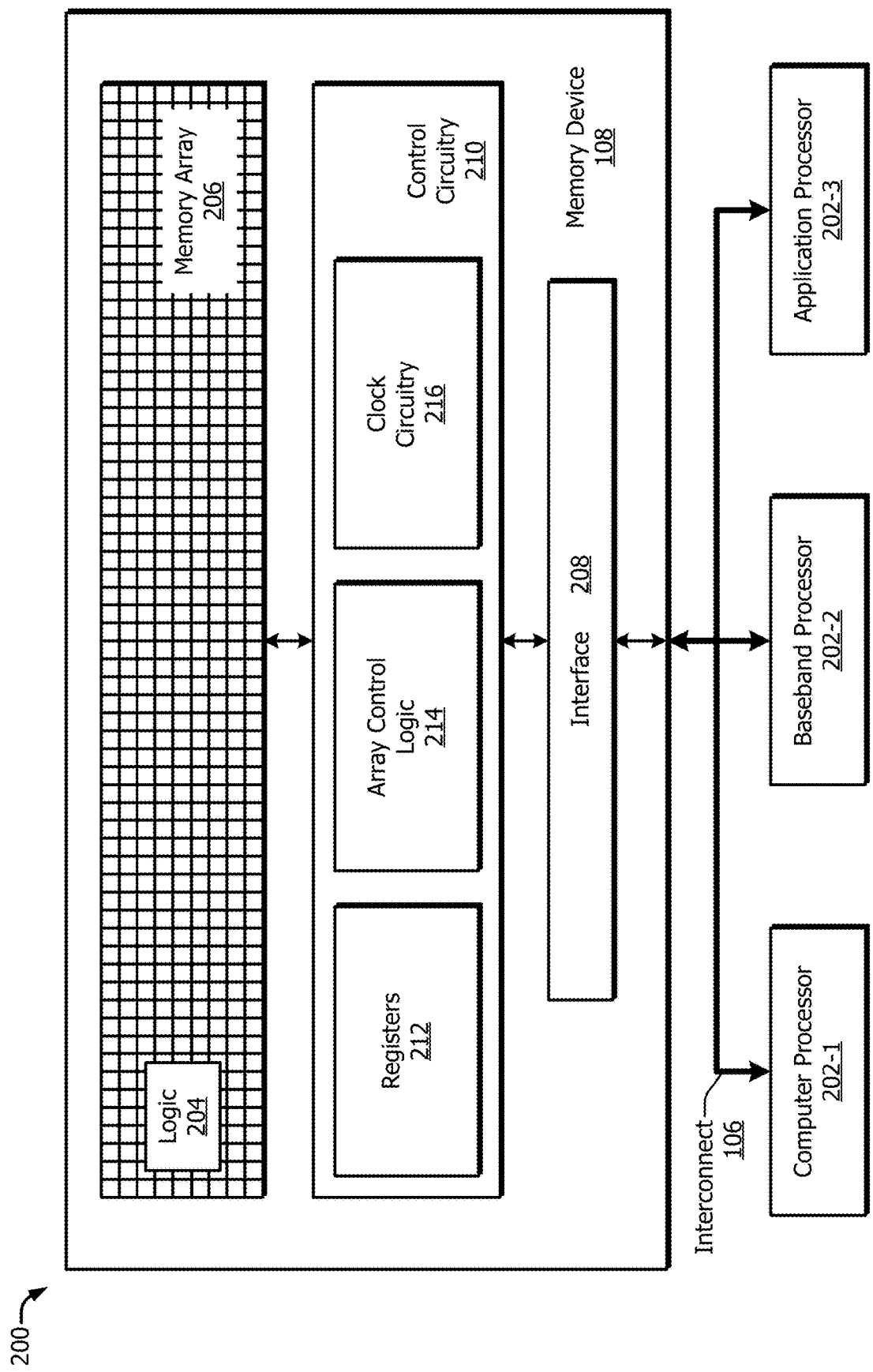
FIG. 2 illustrates an example computing system that can implement aspects of adaptive wordline refresh with a memory device.

FIG. 2 illustrates an example computing system 200 that can implement aspects of adaptive wordline refresh with a memory device. In some implementations, the computing system 200 includes at least one memory device 108, at least one interconnect 106, and at least one processor 202. In the illustrated implementation, the memory device 108 includes at least one wordline-refresh stagger logic circuit 204 (also referred to as logic 204 or logic circuit 204).

The memory device 108 can include, or be associated with, at least one memory array 206, at least one interface 208, and control circuitry 210 operatively coupled to the memory array 206. The memory device 108 can correspond to one or more of the cache memory, the main memory, or a storage memory of the apparatus 102 of FIG. 1. Thus, the memory array 206 can include an array of memory cells, including but not limited to memory cells of DRAM, SDRAM, 3D-stacked DRAM, DDR memory, low-power DRAM, or LPDDR SDRAM. For example, the memory array 206 can include memory cells of SDRAM configured as a memory module with one channel containing either 16 or 8 data (DQ) signals, double-data-rate input/output (I/O) signaling, and supporting a supply voltage of 0.3 to 0.5V. The density of the memory device 108 can range, for instance, from 2 Gb to 32 Gb. The memory array 206 and the control circuitry 210 may be components on a single semiconductor die or on separate semiconductor dies. The memory array 206 or the control circuitry 210 may also be distributed across multiple dies.

The control circuitry 210 can include various components that the memory device 108 can use to perform various operations. These operations can include communicating with other devices, managing memory performance, and performing memory read or write operations. For example, the control circuitry 210 can include one or more registers 212, at least one instance of array control logic 214, and clock circuitry 216. The registers 212 may be implemented, for example, as one or more registers (e.g., a masked-write enablement register) that can store information to be used by the control circuitry 210 or another part of the memory device 108. The array control logic 214 can be circuitry that provides command decoding, address decoding, input/output functions, amplification circuitry, power supply management, power control modes, and other functions. The clock circuitry 216 can synchronize various memory components with one or more external clock signals provided over the interconnect 106, including a command/address clock or a data clock. The clock circuitry 216 can also use an internal clock signal to synchronize memory components.

In the illustrated implementation, the logic circuit 204 is included in or at the memory array 206. In other implementations, the logic circuit 204 may be incorporated in or at another component of the memory device 108, such as a row decoder. As described with respect to the logic circuit 124, the logic circuit 204 can be used to divide wordlines (e.g., rows) of the memory array 206 into groups. For example, the logic circuit 204 can be coupled between groups of wordlines and used to delay or stagger refresh operations at the wordline level to reduce peak power draw during the refresh operations, as described in more detail with reference to FIGS. 2-8. While this delay may slightly increase system latency, it can reduce peak power draw during refresh operations. Reducing power consumption allows memory designers and engineers to make tradeoffs between power distribution network limitations and overall memory latency, which can enable solutions for different customers and product-design parameters.

The interface 208 can couple the control circuitry 210 or the memory array 206 directly or indirectly to the interconnect 106. As shown in FIG. 2, the registers 212, the array control logic 214, and the clock circuitry 216 can be part of a single component (e.g., the control circuitry 210). In other implementations, one or more of the registers 212, the array control logic 214, or the clock circuitry 216 may be separate components on a single semiconductor die or across multiple semiconductor dies. These components may individually or jointly couple to the interconnect 106 via the interface 208.

The interconnect 106 may use one or more of a variety of interconnects that communicatively couple together various components and enable commands, addresses, or other information and data to be transferred between two or more components (e.g., between the memory device 108 and the processor 202). Although the interconnect 106 is illustrated with a single line in FIG. 2, the interconnect 106 may include at least one bus, at least one switching fabric, one or more wires or traces that carry voltage or current signals, at least one switch, one or more buffers, and so forth. Further, the interconnect 106 may be separated into at least a CA bus 116 and a DQ bus 118 (as illustrated in FIG. 1). As discussed above with respect to FIG. 1, the interconnect 106 can be a CXL link or comport with at least one CXL standard. The CXL link can provide an interface on top of the physical layer and electricals of the PCIe 5.0 physical layer.

In some aspects, the memory device 108 may be a "separate" component relative to the host device 104 (of FIG. 1) or any of the processors 202. The separate components can include a PCB, memory card, memory stick, and memory module (e.g., a single in-line memory module (SIMM) or dual in-line memory module (DIMM)). Thus, separate physical components may be located together within the same housing of an electronic device or may be distributed over a server rack, a data center, and so forth. Alternatively, the memory device 108 may be integrated with other physical components, including the host device 104 or the processor 202, by being combined on a PCB or in a single package or an SoC.

The designed apparatuses and methods may be appropriate for memory designed for lower-power operations or energy-efficient applications. An example of a memory standard related to low-power applications is the LPDDR standard for SDRAM as promulgated by the JEDEC Solid State Technology Association. In this document, some terminology may draw from one or more of these standards or versions thereof, like the LPDDR5 standard, for clarity. The described principles, however, are also applicable to memories that comport with other standards, including other LPDDR standards (e.g., earlier versions or future versions like LPDDR6) and to memories that do not adhere to a standard.

As shown in FIG. 2, the processors 202 may include a computer processor 202-1, a baseband processor 202-2, and an application processor 202-3, coupled to the memory device 108 through the interconnect 106. The processors 202 may include or form a part of a CPU, GPU, SoC, ASIC, or FPGA. In some cases, a single processor can comprise multiple processing resources, each dedicated to different functions (e.g., modem management, applications, graphics, central processing). In some implementations, the baseband processor 202-2 may include or be coupled to a modem (not illustrated in FIG. 2) and referred to as a modem processor. The modem or the baseband processor 202-2 may be coupled wirelessly to a network via, for example, cellular, Wi-Fi®, Bluetooth®, near field, or another technology or protocol for wireless communication.

In some implementations, the processors 202 may be connected directly to the memory device 108 (e.g., via the interconnect 106). In other implementations, one or more of the processors 202 may be indirectly connected to the memory device 108 (e.g., over a network connection or through one or more other devices). Further, the processor 202 may be realized similar to the processor 110 of FIG. 1. Accordingly, a respective processor 202 can include or be associated with a respective link controller, like the link controller 114 illustrated in FIG. 1. Alternatively, two or more processors 202 may access the memory device 108 using a shared link controller 114.

Example Techniques and Hardware

Figure 3:
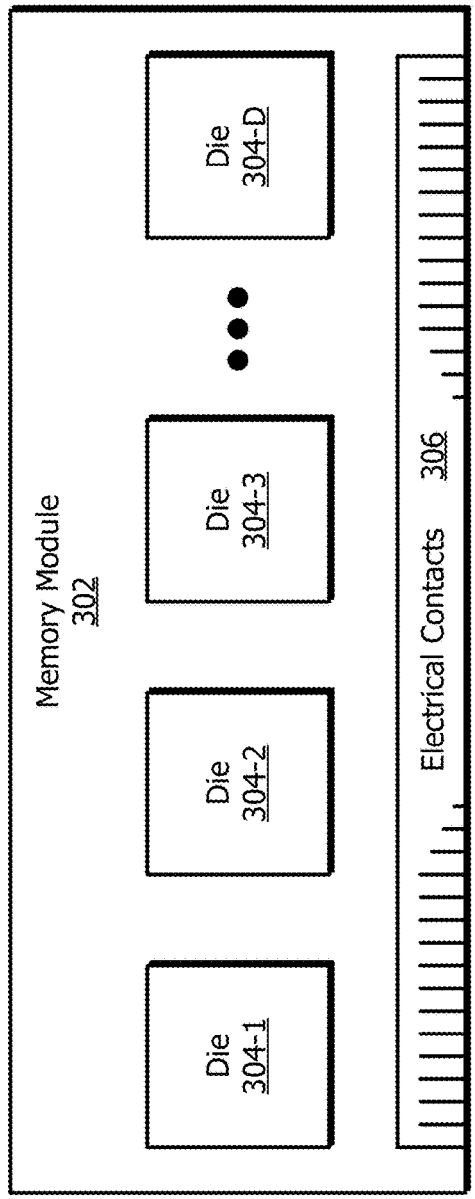
FIG. 3 illustrates an example memory device.

FIG. 3 illustrates an example memory device 300. An example memory module 302 includes multiple dies 304. As illustrated, the memory module 302 includes a first die 304-1, a second die 304-2, a third die 304-3, and a $D^{th}$ die 304-D, with "D" representing a positive integer. As a few examples, the memory module 302 can be a SIMM or a DIMM. As another example, the memory module 302 can interface with other components via a bus interconnect (e.g., a Peripheral Component Interconnect Express (PCIe) bus). The memory device 108 illustrated in FIGS. 1 and 2 can correspond, for example, to a single die 304, multiple dies 304-1 through 304-D, or a memory module 302 with at least one die 304. As shown, the memory module 302 can include one or more electrical contacts 306 (e.g., pins) to interface the memory module 302 to other components.

The memory module 302 can be implemented in various manners. For example, the memory module 302 may include a PCB, and the multiple dies 304-1 through 304-D may be mounted or otherwise attached to the PCB. The dies 304 (e.g., memory dies) may be arranged in a line or along two or more dimensions (e.g., forming a grid or array). The dies 304 may have a similar size or may have different sizes. Each die 304 may be similar to another die 304 or unique in size, shape, data capacity, or control circuitries. The dies 304 may also be positioned on a single side or on multiple sides of the memory module 302. In some cases, the memory module 302 may be part of a CXL memory system or module. Additionally or alternatively, the memory module 302 may include or be a part of another memory device, such as the memory device 108.

Figure 4:
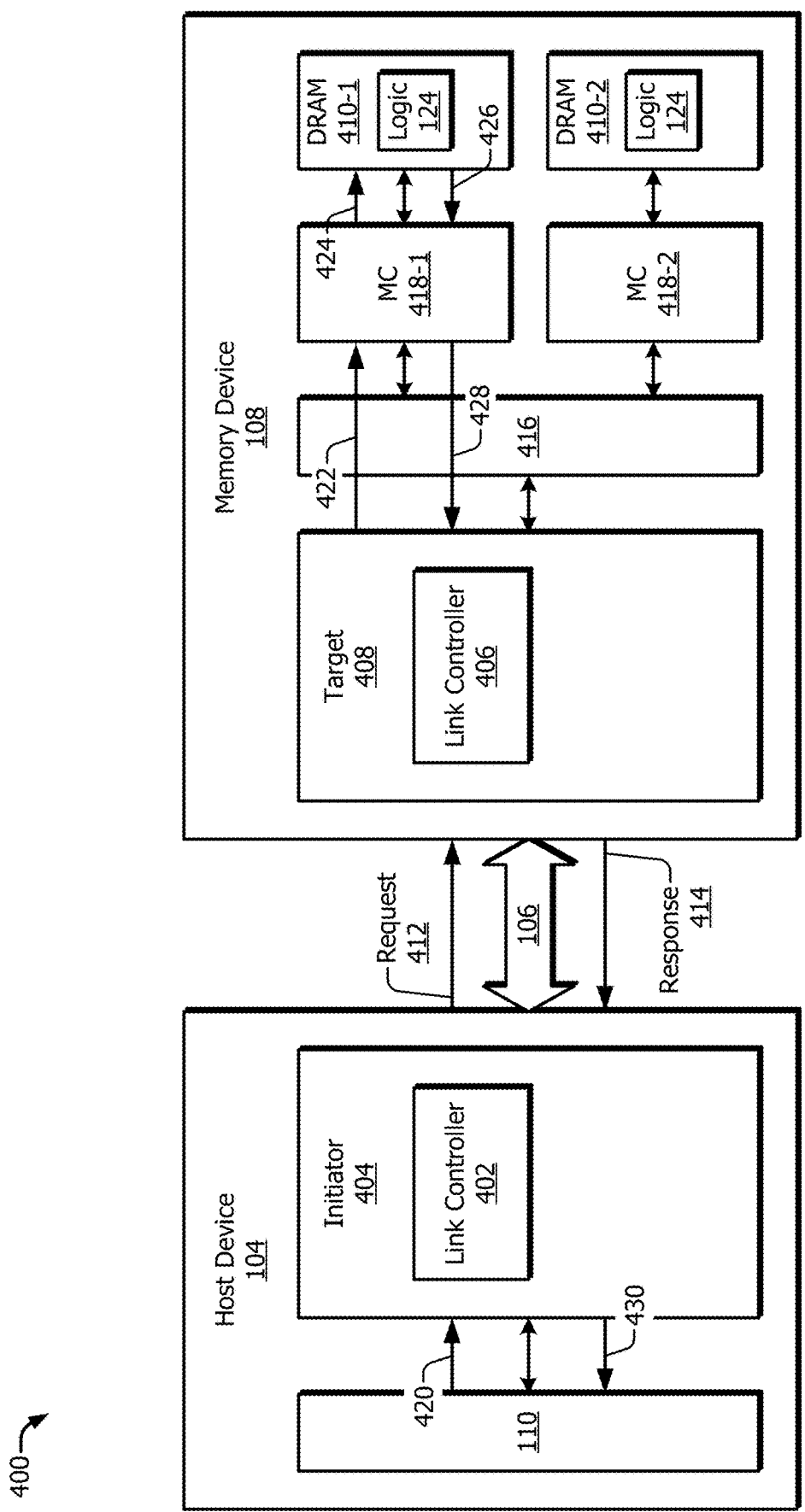
FIG. 4 illustrates an example of a system that includes a host device and a memory device coupled together via an interconnect.

FIG. 4 illustrates an example of a system 400 that includes a host device 104 and a memory device 108 that are coupled together via an interconnect 106. The system 400 may form at least part of an apparatus 102 as shown in FIG. 1. As illustrated, the host device 104 includes a processor 110 and a link controller 402, which can be realized with at least one initiator 404. Thus, the initiator 404 can be coupled to the processor 110 or to the interconnect 106 (including to both), and the initiator 404 can be coupled between the processor 110 and the interconnect 106. Examples of initiators 404 may include a leader, a primary, a master, a main component, and so forth.

In the illustrated example system 400, the memory device 108 includes a link controller 406, which may be realized with at least one target 408. The target 408 can be coupled to the interconnect 106. Thus, the target 408 and the initiator 404 can be coupled to each other via the interconnect 106. Examples of targets 408 may include a follower, a secondary, a slave, a responding component, and so forth. The memory device 108 also includes a memory (e.g., the memory 122 of FIG. 1), which may be realized with at least one memory module or other component, such as a DRAM 410, as is described further below.

In example implementations, the initiator 404 includes the link controller 402, and the target 408 includes the link controller 406. The link controller 402 or the link controller 406 can instigate, coordinate, cause, or otherwise control signaling across a physical or logical link realized by the interconnect 106 in accordance with one or more protocols. The link controller 402 may be coupled to the interconnect 106. The link controller 406 may also be coupled to the interconnect 106. Thus, the link controller 402 can be coupled to the link controller 406 via the interconnect 106. Each link controller 402 or 406 may, for instance, control communications over the interconnect 106 at a link layer or at one or more other layers of a given protocol. Communication signaling may include, for example, a request 412 (e.g., a write request or a read request), a response 414 (e.g., a write response or a read response), and so forth.

The memory device 108 may further include at least one interconnect 416 and at least one memory controller 418 (e.g., MC 418-1 and MC 418-2). Within the memory device 108, and relative to the target 408, the interconnect 416, the memory controller 418, and/or the DRAM 410 (or other memory component) may be referred to as a "backend" component of the memory device 108. In some cases, the interconnect 416 is internal to the memory device 108 and may operate the same as or differently from the interconnect 106.

As shown, the memory device 108 may include multiple memory controllers 418-1 and 418-2 and/or multiple DRAMs 410-1 and 410-2. Although two each are shown, the memory device 108 may include one or more memory controllers and/or one or more DRAMs. For example, a memory device 108 may include four memory controllers and 16 DRAMs, such as four DRAMs per memory controller. The memory components of the memory device 108 are depicted as DRAM as only an example, for one or more of the memory components may be implemented as another type of memory. For instance, the memory components may include nonvolatile memory like flash or PCM. Alternatively, the memory components may include other types of volatile memory like SRAM. A memory device 108 may also include any combination of memory types.

In some cases, the memory device 108 may include the target 408, the interconnect 416, the at least one memory controller 418, and the at least one DRAM 410 within a single housing or other enclosure. The enclosure, however, may be omitted or may be merged with an enclosure for the host device 104, the system 400, or an apparatus 102 (of FIG. 1). In some cases, each of these components can be realized with a separate IC. In some of such cases, the interconnect 416 can be disposed on a PCB. Each of the target 408, the memory controller 418, and the DRAM 410 may be fabricated on at least one IC and packaged together or separately. The packaged ICs may be secured to or otherwise supported by the PCB and may be directly or indirectly coupled to the interconnect 416. In other cases, the target 408, the interconnect 416, and the one or more memory controllers 418 may be integrated together into one IC. In some of such cases, this IC may be coupled to a PCB, and one or more modules for the memory components may also be coupled to the same PCB, which can form a CXL memory device 108. This memory device 108 may be enclosed within a housing or may include such a housing. The components of the memory device 108 may, however, be fabricated, packaged, combined, and/or housed in other manners.

As illustrated in FIG. 4, the target 408, including the link controller 406 thereof, can be coupled to the interconnect 416. Each memory controller 418 of the multiple memory controllers 418-1 and 418-2 can also be coupled to the interconnect 416. Accordingly, the target 408 and each memory controller 418 of the multiple memory controllers 418-1 and 418-2 can communicate with each other via the interconnect 416. Each memory controller 418 is coupled to at least one DRAM 410. As shown, each respective memory controller 418 of the multiple memory controllers 418-1 and 418-2 is coupled to at least one respective DRAM 410 of the multiple DRAMs 410-1 and 410-2. Each memory controller 418 of the multiple memory controllers 418-1 and 418-2 may, however, be coupled to a respective set of multiple DRAMs 410 or other memory components.

Each memory controller 418 can access at least one DRAM 410 by implementing one or more memory access protocols to facilitate reading or writing data based on at least one memory address. The memory controller 418 can increase bandwidth or reduce latency for the memory accessing based on the memory type or organization of the memory components, like the DRAMs 410. The multiple memory controllers 418-1 and 418-2 and the multiple DRAMs 410-1 and 410-2 can be organized in many different manners. For example, each memory controller 418 can realize one or more memory channels for accessing the DRAMs 410. Further, the DRAMs 410 can be manufactured to include one or more ranks, such as a single-rank or a dual-rank memory module. Each DRAM 410 (e.g., at least one DRAM IC chip) may also include multiple banks, such as 8 or 16 banks.

This document now describes examples of the host device 104 accessing the memory device 108. The examples are described in terms of a general access which may include a memory read access (e.g., a retrieval operation) or a memory write access (e.g., a storage operation). The processor 110 can provide a memory access request 420 to the initiator 404. The memory access request 420 may be propagated over a bus or other interconnect that is internal to the host device 104. This memory access request 420 may be or may include a read request or a write request. The initiator 404, such as the link controller 402 thereof, can reformulate the memory access request into a format that is suitable for the interconnect 106. This formulation may be performed based on a physical protocol or a logical protocol (including both) applicable to the interconnect 106. Examples of such protocols are described below.

The initiator 404 can thus prepare a request 412 and transmit the request 412 over the interconnect 106 to the target 408. The target 408 receives the request 412 from the initiator 404 via the interconnect 106. The target 408, including the link controller 406 thereof, can process the request 412 to determine (e.g., extract or decode) the memory access request. Based on the determined memory access request, the target 408 can forward a memory request 422 over the interconnect 416 to a memory controller 418, which is the first memory controller 418-1 in this example. For other memory accesses, the targeted data may be accessed with the second DRAM 410-2 through the second memory controller 418-2.

The first memory controller 418-1 can prepare a memory command 424 based on the memory request 422. The first memory controller 418-1 can provide the memory command 424 to the first DRAM 410-1 over an interface or interconnect appropriate for the type of DRAM or other memory component. The first DRAM 410-1 receives the memory command 424 from the first memory controller 418-1 and can perform the corresponding memory operation. Based on the results of the memory operation, the first DRAM 410-1 can generate a memory response 426. If the memory request 412 is for a read operation, the memory response 426 can include the requested data. If the memory request 412 is for a write operation, the memory response 426 can include an acknowledgement that the write operation was performed successfully. The first DRAM 410-1 can return the memory response 426 to the first memory controller 418-1.

The first memory controller 418-1 receives the memory response 426 from the first DRAM 410-1. Based on the memory response 426, the first memory controller 418-1 can prepare a memory response 428 and transmit the memory response 428 to the target 408 via the interconnect 416. The target 408 receives the memory response 428 from the first memory controller 418-1 via the interconnect 416. Based on this memory response 428, and responsive to the corresponding request 412, the target 408 can formulate a response 414 for the requested memory operation. The response 414 can include read data or a write acknowledgement and be formulated in accordance with one or more protocols of the interconnect 106.

To respond to the memory request 412 from the host device 104, the target 408 can transmit the response 414 to the initiator 404 over the interconnect 106. Thus, the initiator 404 receives the response 414 from the target 408 via the interconnect 106. The initiator 404 can therefore respond to the "originating" memory access request 420, which is from the processor 110 in this example. To do so, the initiator 404 prepares a memory access response 430 using the information from the response 414 and provides the memory access response 430 to the processor 110. In this way, the host device 104 can obtain memory access services from the memory device 108 using the interconnect 106. Example aspects of an interconnect 106 are described next.

The interconnect 106 can be implemented in a myriad of manners to enable memory-related communications to be exchanged between the initiator 404 and the target 408. Generally, the interconnect 106 can carry memory-related information, such as data or a memory address, between the initiator 404 and the target 408. In some cases, the initiator 404 or the target 408 (including both) can prepare memory-related information for communication across the interconnect 106 by encapsulating such information. The memory-related information can be encapsulated into, for example, at least one packet (e.g., a flit). One or more packets may include headers with information indicating or describing the content of each packet.

In example implementations, the interconnect 106 can support, enforce, or enable memory coherency for a shared memory system, for a cache memory, for combinations thereof, and so forth. Additionally or alternatively, the interconnect 106 can be operated based on a credit allocation system. Possession of a credit can enable an entity, such as the initiator 404, to transmit another memory request 412 to the target 408. The target 408 may return credits to "refill" a credit balance at the initiator 404. A credit-based communication scheme across the interconnect 106 may be implemented by credit logic of the target 408 or by credit logic of the initiator 404 (including by both working together in tandem). In some implementations, rows (wordlines) of a memory array (e.g., a memory array included in a DRAM bank or die, such as the DRAMs 410 or multiple banks of the dies 304) can be divided into groups. For example, the logic circuit 124 (or the logic circuit 204, not shown in FIG. 4) can be coupled between the groups of wordlines and used to delay or stagger refresh operations at the wordline level to reduce peak power draw during the refresh operations, as described in more detail with reference to FIG. 5-1 through FIG. 8. Example aspects of a wordline-refresh stagger logic circuit that can implement adaptive wordline refresh, such as the logic circuit 124 or the logic circuit 204), are described below with reference to FIGS. 5-1 through 8. Additionally or alternatively, the link controller 120 (of FIG. 1) may also guide or support refresh operations of the DRAMs 410 or multiple banks of the dies 304 (of FIG. 3).

The system 400, the initiator 404 of the host device 104, or the target 408 of the memory device 108 may operate or interface with the interconnect 106 in accordance with one or more physical or logical protocols. For example, the interconnect 106 may be built in accordance with a Peripheral Component Interconnect Express (PCIe or PCI-e) standard. Applicable versions of the PCIe standard may include 1.x, 2.x, 3.x, 4.0, 5.0, 6.0, and future or alternative versions. In some cases, at least one other standard is layered over the physical-oriented PCIe standard. For example, the initiator 404 or the target 408 can communicate over the interconnect 106 in accordance with a Compute Express Link (CXL) standard. Applicable versions of the CXL standard may include 1.x, 2.0, and future or alternative versions. The CXL standard may operate based on credits, such as read credits and write credits. In such implementations, the link controller 402 and the link controller 406 can be CXL controllers.

Figures 1, 5:
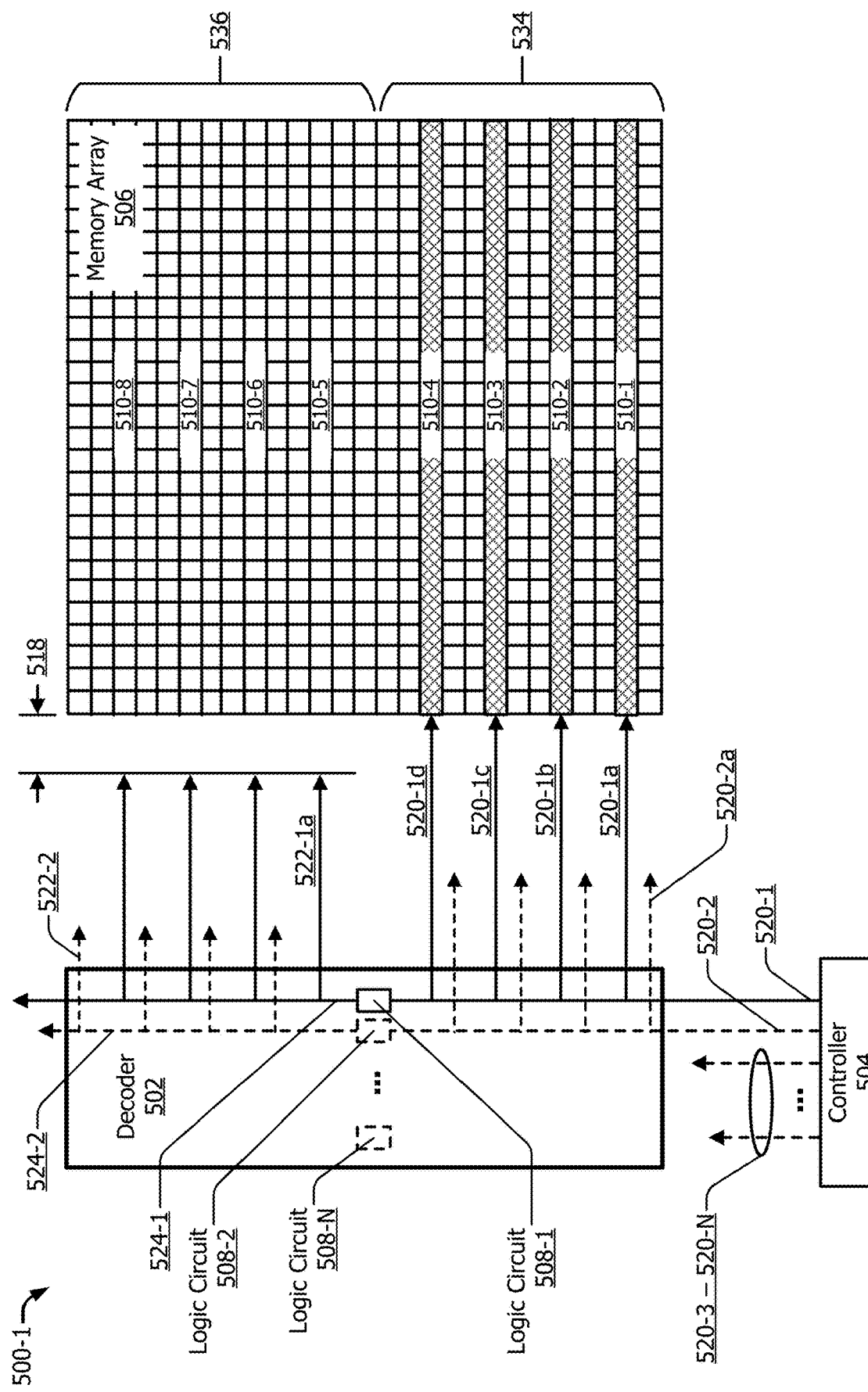
Figures 2, 5:
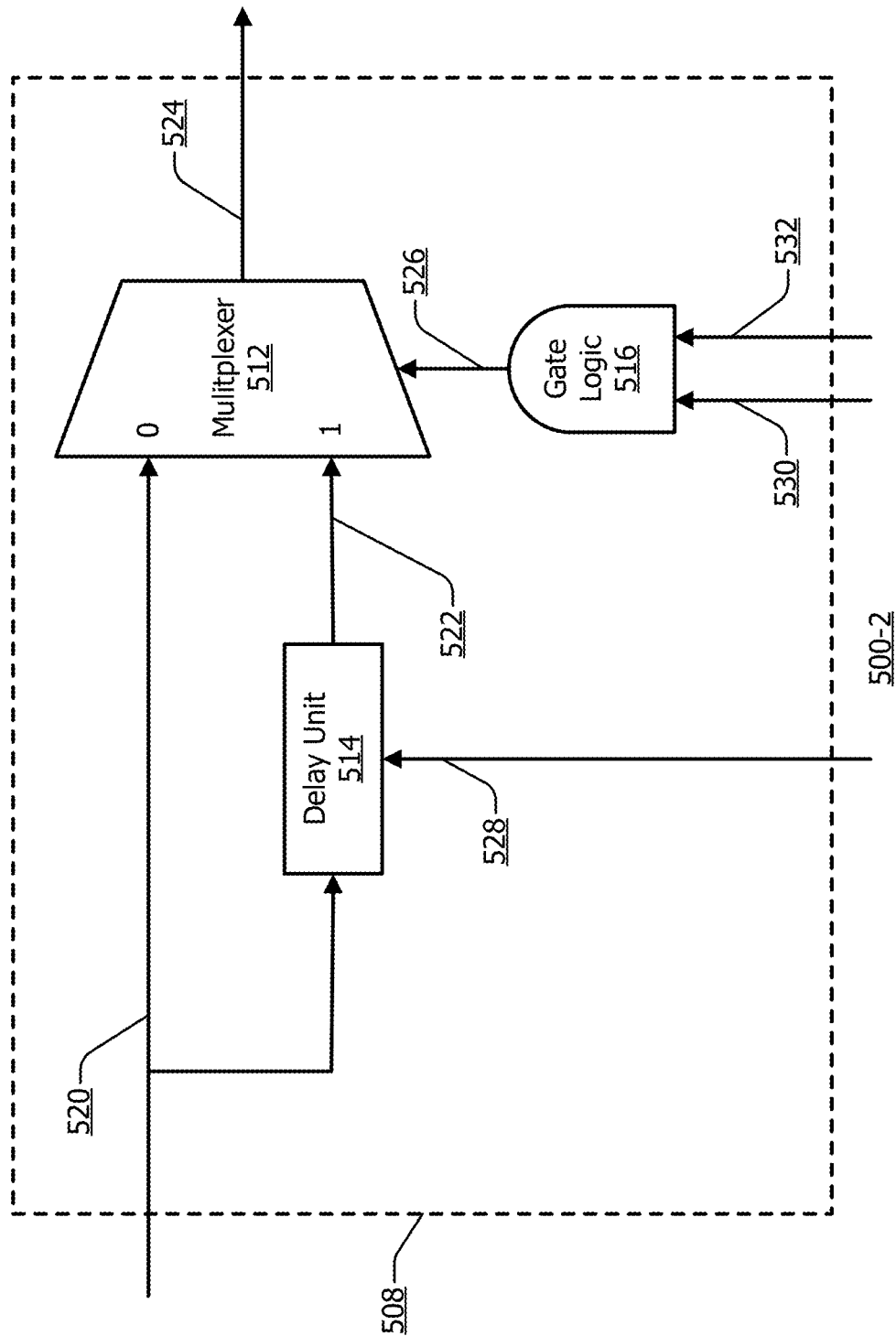

FIG. 5-1 illustrates a portion of an example memory system 500-1 that can implement aspects of adaptive wordline refresh. The example memory system 500-1 can include a decoder 502, a controller 504, a memory array 506 (array 506), and at least one wordline-refresh stagger logic circuit 508 (logic circuit 508). The decoder 502 can be any suitable decoder that can receive addresses for memory cells of the array 506 (e.g., row addresses) from the controller 504 and transmit signals (e.g., refresh commands) to the wordlines based on the addresses. The controller 504 can be a controller or processor that can transmit signals to the decoder 502 and the memory array 506. For example, the controller 504 can be realized with the link controller 120, the control circuitry 210, or the memory controller 418.

The memory array 506 can be any of a variety of memory types and may include multiple wordlines 510 that can be used to activate or energize memory cells on corresponding rows of the array 506 (e.g. responsive to a refresh command). For example, the memory array 506 can be realized with, or as part of, the memory 122 of FIG. 1. The logic circuit 508 can be coupled to the multiple wordlines 510 of the memory array 506 in a number of configurations. As shown in FIG. 5-1, the logic circuit 508 is coupled to the wordlines through the decoder 502. In other implementations, the logic circuit 508 can be coupled to the multiple wordlines 510 in a number of other ways that enable aspects of adaptive wordline refresh, as described in this document.

In some implementations, the example memory system 500-1 may be implemented as part of another device, such as the memory device 108 (e.g., with or as part of the memory 122), the memory module 302, or the DRAM 410. Additionally or alternatively, the example memory system 500-1 may be implemented as part of a CXL device (e.g., a Type 1 CXL device, a Type 2 CXL device, or a Type 3 CXL device). For example, the memory system 500-1 can include or be coupled to an interface that can couple to a host device (e.g., the host device 104) via an interconnect, such as the interconnect 106. The memory system 500-1 can also include or be coupled to a link controller (e.g., the link controller 406) that can be coupled to the interface and communicate with the host device. In some implementations, the interconnect can be an interconnect that can comport with at least one Compute Express Link (CXL) standard and the link controller may be a CXL controller.

In some implementations, the example memory system 500-1 (or a component of the memory device 108 that is coupled to the example memory system 500-1) may include logic that can provide timing information to the host device 104 (e.g. to the link controller 114 and/or the processor 110). Examples of the timing information may include, the length of the delay interval, the number of groups, and so forth. Further, the host device 104 may transmit an indication of an amount of peak power that the memory device (e.g., the example memory system 500-1) is permitted to draw at a particular time. The host device 104 may include additional logic to receive and/or transmit this information.

FIG. 5-2 depicts a detail view 500-2 that illustrates an example implementation of the logic circuit 508. In the detail view 500-2, the logic circuit 508 includes a multiplexer 512, a delay unit 514, and gate logic 516. The multiplexer 512 can be any suitable circuitry that can receive multiple signals and determine which of the multiple signals to transmit, based on another input (e.g., from the gate logic 516). The delay unit 514 can be any of a variety of suitable circuits that can determine a duration of a time interval 518 (shown in FIG. 5-1) and delay propagation of a received signal for the duration of the time interval 518. For example, the delay unit 514 can be a digital delay line or a voltage-controlled delay line that can transmit the delayed signal to the multiplexer 512 after the time interval 518. The gate logic 516 can be any of a number of logic gate circuits, including an AND gate.

In example operations of the example logic circuit 508, the multiplexer 512 can receive (e.g., from the controller 504) an activation signal 520 and a delayed activation signal 522. The activation signal 520 can be indicative of a command to activate multiple wordlines 510 of the memory array 506 at approximately a same time (e.g., a refresh command). The delay unit can delay the activation signal 520 for the time interval to produce the delayed activation signal 522. The multiplexer 512 can transmit an output signal 524, based on a mode-enable signal 526 (e.g., from the gate logic 516). The mode-enabled signal 526 can indicate whether an operational mode is enabled.

The operational mode can be a mode or feature to delay activation of at least one wordline 510 of the multiple wordlines (e.g., an adaptive wordline refresh mode). The output signal 524 can be the activation signal 520 or the delayed activation signal 522 (e.g., from the delay unit 514). For example, in response to the mode-enable signal 526 indicating an operational mode is enabled, the logic circuit 508 (e.g., via the multiplexer 512) can delay propagation of the activation signal 520 for the time interval 518 by transmitting the delayed activation signal 522. Conversely, in response to the mode-enable signal 526 indicating the operational mode is not enabled the multiplexer 512 can transmit the activation signal 520 (e.g., with no delay).

The delay unit 514 can determine the duration of the time interval 518 (e.g., the delay) based on a delay-duration signal 528. The delay-duration signal 528 can be a signal based on one or more bits that can be stored using a register or fuse associated with the memory array 506, such as a mode register or a test mode fuse. In an example implementation, the delay-duration signal 528 can be based on two bits, which allows the time interval 518 to take one of four values (e.g., one value for 00 and other values for 01, 10, and 11). In other implementations, the delay-duration signal 528 can be based on another quantity of bits.

The gate logic 516 can transmit the mode-enable signal 526 to the multiplexer 512. The mode-enable signal 526 can be based on other signals that represent criteria that determine whether the adaptive wordline refresh mode is enabled. For example, the gate logic 516 can receive an activation-on signal 530 and a delay-on signal 532. The activation-on signal 530 can indicate that the logic circuit 508 (e.g., the multiplexer 512) received the activation signal 520. The activation-on signal 530 can be based on at least one bit that can be stored using a register or fuse, such as a mode register or a test mode fuse. The delay-on signal 532 can indicate that a status of the feature to delay activation of at least one wordline is enabled (e.g., that operational mode is enabled). The delay-on signal 532 can be based on at least one bit stored using a register or fuse, such as a mode register or a test mode fuse.

The registers and/or fuses used to store the bit or bits upon which the delay-duration signal 528, the activation-on signal 530, and/or the delay-on signal 532 are based can be separate, shared, or a combination of separate and shared. Some or all of the stored bit values can be set by a device manufacturer or by a customer (e.g., by adjusting a mode register value). In some cases, the values may be set by the manufacturer and cannot be adjusted. In other cases, the manufacturer may set a value and allow means for the customer to change or adjust some or all of the values.

In example operations, the mode-enable signal 526 can indicate that the operational mode is enabled by transmitting a high signal (e.g., "1") and that the operational mode is not enabled by transmitting a low signal (e.g., "0"). For example, the activation-on signal 530 can be driven, or set, to high (e.g., "1") to indicate that the multiplexer 512 received the activation signal 520 (e.g., the refresh command). Similarly, the delay-on signal 532 can be driven, or set, to high (e.g., "1") to indicate that the status of the feature to delay activation of at least one wordline is an enabled status. Conversely, the activation-on signal 530 can be driven, or set, to low (e.g., "0") to indicate that the multiplexer 512 has not received the activation signal 520 (e.g., the refresh command). Similarly, the delay-on signal 532 can be driven, or set, to low (e.g., "0") to indicate that the status of the feature to delay activation of at least one wordline is a not-enabled status. In some implementations, the gate logic 516 is realized with an AND gate, and only when both the activation-on signal 530 and the delay-on signal 532 are driven or set to high will the mode-enable signal 526 be driven high (e.g., "1") to indicate that the operation mode is enabled.

In these implementations, therefore, the output signal 524 is the delayed activation signal 522 when both the multiplexer 512 has received (e.g., is receiving) the activation signal 520 and the status of the feature to delay activation of at least one wordline is "enabled" (e.g., when the mode-enable signal 526 has been driven high), as shown in FIG. 1. Accordingly, the output signal 524 is the activation signal 520 (e.g., without delay) when the multiplexer 512 has received (e.g., is receiving) the activation signal 520 but the status of the feature to delay activation of at least one wordline is "not enabled" (e.g., when the mode-enable signal 526 has been driven low).

When the multiplexer 512 has not received (e.g., is not receiving) the activation signal 520 (or some other signal indicative of a command to activate multiple wordlines at approximately a same time), the mode-enable signal 526 will be driven low. This is because the activation-on signal 530 will be low and, in this example, both the delay-on signal 532 and the activation-on signal 530 must be high for the mode-enable signal 526 to be high. Thus, there is no delay when the multiplexer 512 receives a signal that is not indicative of a command to activate multiple wordlines at the same time or when the operational mode is not enabled In the foregoing description, some or all of the "high" and "low" signals could be reversed, so long as the relationship regarding which output signal 524 is transmitted for which sets of conditions is maintained (e.g., propagation of the activation signal 520 is delayed when either the operational mode is not enabled or the activation signal 520 is not received).

Returning to FIG. 5-1, the logic circuit 508 can be used to divide the wordlines 510 of the array 506 into groups or sets and stagger the timing of refresh operations (or other operations that activate multiple wordlines at the same time). As shown in FIG. 1, the logic circuit 508 can be coupled between a first group of wordlines 534 of the multiple wordlines 510 and a second group of wordlines 536 of the multiple wordlines 510. In some implementations, the first group of wordlines 534 and the second group of wordlines 536 include a same quantity of wordlines 510. In other implementations (as shown in FIG. 5-1), the first group of wordlines 534 and the second group of wordlines 536 may include different quantities of wordlines 510 and the number of wordlines activated by the activation signal (520 or 522) may also be the same or different.

Coupling the logic circuit 508 between the first group of wordlines 534 and the second group of wordlines 536 enables the delay in activating the second group of wordlines 536 (e.g., staggering the wordline-level refresh operation). For example, as shown in FIG. 5-1, the controller 504 transmits an activation signal 520-1 to the memory array 506 using the decoder 502. The activation signal 520-1 can be indicative of a command to activate multiple wordlines at approximately the same time (e.g., the eight wordlines 510-1 through wordline 510-8). In some cases, the activation signal 520-1 may be indicative of a command to activate, at approximately the same time, at least one wordline 510 in each group formed by the logic circuit 508 (e.g., in the first group 534, the second group 536, and any other additional groups). In response to receiving the activation signal 520-1, the wordlines 510-1 through 510-4 are activated by the activation signals 520-1a through 520-1d from the decoder 502 to the array 506 (the activated, or refreshed, wordlines 510 are shown by crosshatching on the corresponding rows).

In this example, assume that the status of the operational mode is the enabled status. Thus, when the logic circuit 508-1 receives the activation signal 520-1, the output signal 524-1 transmitted by the logic circuit 508-1 is the delayed activation signal 522-1 (for clarity, only the delayed activation signal 522-1a is shown in FIG. 5-1). The delayed activation signal 522-1 is delayed (staggered) relative to the activation signal 520-1 for the time interval 518, as shown in FIG. 5-1 and therefore the wordlines 510-5 through 510-8 are not yet activated (e.g., not yet refreshed, as shown by the absence of crosshatching on the corresponding rows).

In some implementations, the controller 504 can transmit multiple activation signals 520 to the array 506. For example, additional activation signals 520-2 through 520-N (shown with dashed lines) can be transmitted to the array 506 through the decoder 502. Thus, the activation signal 520-2a can activate a corresponding wordline 510. For clarity, the activated wordline and the additional activation signals 520-2 are omitted. Assuming again that the status of the operational mode is the enabled status, when the logic circuit 508-2 receives the activation signal 520-2, the output signal 524-2 transmitted by the logic circuit 508-2 is the delayed activation signal 522-2 (for clarity, only one delayed activation signal 522-2 is shown). The delayed activation signals 522-2 are delayed (staggered) relative to the activation signal 520-2 for the time interval 518 (as shown by the length of the dashed line arrows representing the delayed activation signals 522-2).

In the described example, logic circuits 508-1 through 508-N are shown, corresponding to activation signals 520-1 through 520-N. While shown as separate components, the logic circuits 508-1 through 508-N can be a single component capable of handling all of the activation signals 520-1 through 520-N or multiple components that can handle more than one, but less than all of the activation signals 520-1 through 520-N, and so forth. Further, while FIG. 5-1 illustrates aspects of adaptive wordline refresh using the logic circuit 508 to divide the multiple wordlines 510 into two groups, additional logic circuits 508 could be used to divide the multiple wordlines 510 into more groups. For example, two logic circuits 508 can be used to divide the multiple wordlines 510 into three groups, three logic circuits 508 can be used to divide the multiple wordlines 510 into four groups, and so on. Additionally, as described above with reference to the first group 534 and the second group 536, the multiple groups can include different numbers of wordlines 510. Further, the activation signal 520, indicative of the command to activate multiple wordlines 510, is generally indicative of a command to activate at least one wordline in each group of wordlines.

In implementations with multiple groups, the length of time the activation signal 520 is delayed (e.g., the time interval 518) may be the same for each logic circuit 508, different for each logic circuit 508, or some intervals may be different and others the same. For example, if the multiple wordlines are divided into groups with equal quantities of wordlines 510, the time interval 518 may be the same for each logic circuit 508. If, however, some groups of wordlines 510 includes more wordlines 510 than other groups, the time interval 518 of the logic circuit 508 before the larger group(s) may be longer because the power-consumption (e.g., current) spike from the larger group(s) may be larger than for the smaller groups.

Figure 6:
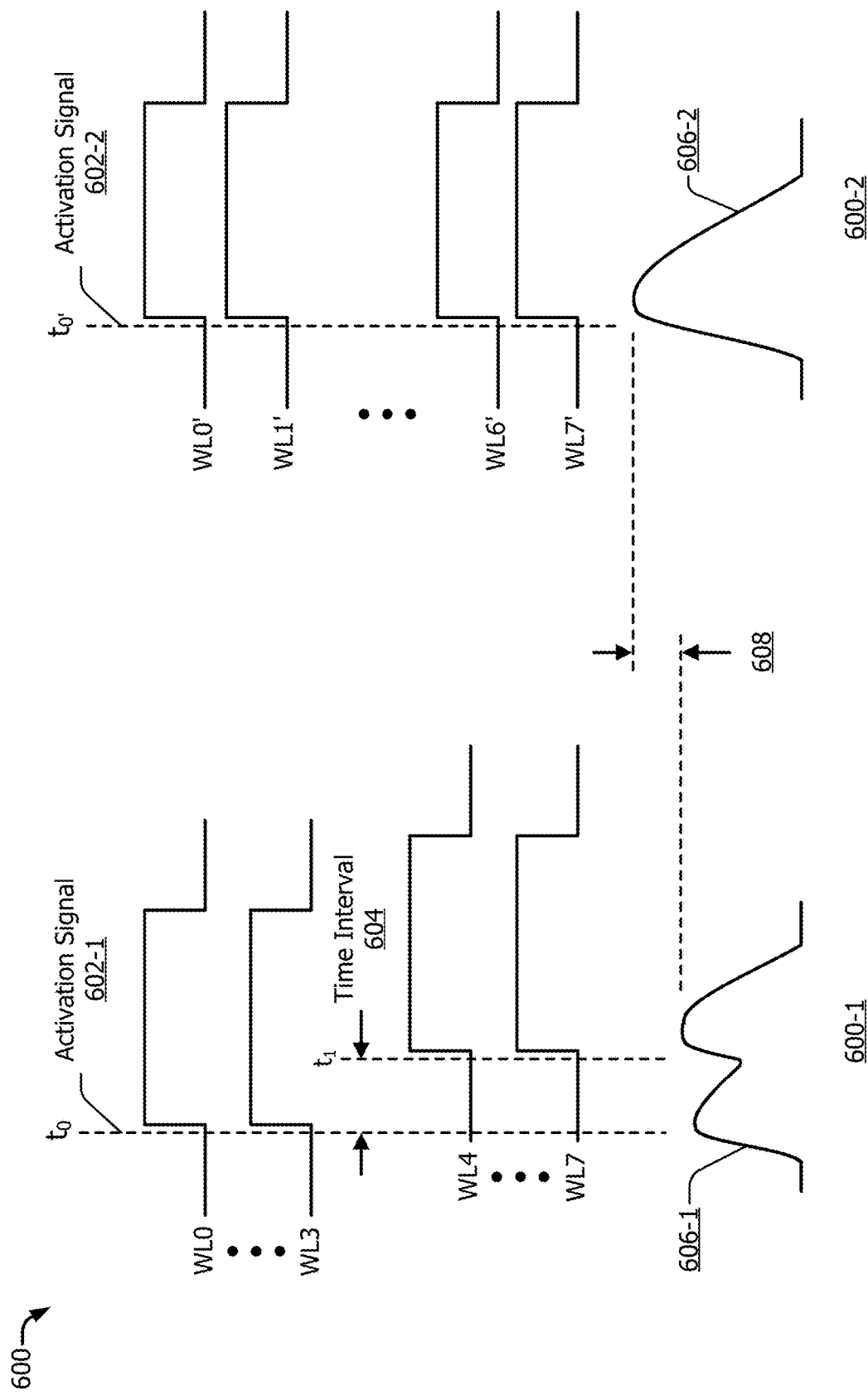
FIG. 6 illustrates example timing and signaling operations that can be used with the logic circuit of FIG. 5-2 to implement aspects of adaptive wordline refresh.

FIG. 6 illustrates generally, at 600, example timing and signaling operations that can be used with a logic circuit (e.g., the logic circuit 508, 124, or 204) to implement aspects of adaptive wordline refresh with a memory device. For example, dividing the wordlines and staggering the refresh operations and/or activations, as described with reference to FIG. 5-1 and FIG. 5-2, can lower the peak power (e.g., current) consumed for a given activation or refresh operation (e.g., a refresh pump).

Consider an example illustrated in a detail view 600-1. The detail view 600-1 shows example signal diagrams for eight wordlines, labeled WL0 through WL7. In this example, the logic circuit is coupled between WL3 and WL4 (for clarity, the logic circuit is not shown in FIG. 6). At $t_0$, an activation signal 602-1 (e.g., the activation signal 520) activates WL0-WL3. After propagation of the activation signal 602-1 is delayed for a time interval 604 (by the logic circuit) the activation signal 602-1 activates WL4-WL7 at L.

The detail view 600-1 also includes an example power-consumption curve 606-1, which represents power consumption associated with WL0-WL7 over time. As shown on curve 606-1, the power consumption increases when WL0-WL3 are activated, decreases over the time interval 604, increases again when WL4-WL7 are activated at ti, and then returns to the pre-activation level.

By way of comparison, consider another example, illustrated in another detail view 600-2. The other detail view 600-2 shows other example signal diagrams for wordlines WL0'-WL7'. In the other example, there is no logic circuit is coupled between any of the wordlines WL0'-WL7'. At $t_{0'}$, another activation signal 602-2 activates WL0'-WL7'. The detail view 600-2 includes another example power-consumption curve 606-2, which represents power consumption associated with WL0'-WL7' over time. As shown, the power consumption increases at $t_{0'}$ when WL0'-WL7' are activated and then decreases over time to the pre-activation level.

Power consumption for activating four wordlines can be less than for activating eight worldlines. Thus, because activation of WL4-WL7 in the detail view 600-1 is staggered by the time interval 604, peak power consumption of curve 606-1 can be lower than the peak power consumption of curve 606-2 for unstaggered activation of WL0'-WL7'. The difference in peak power consumption is shown by a gap 608.

Because of the time interval 604 (or 518), there can be a time penalty (e.g., an increase in a refresh cycle time, such as tRFC). The time penalty can be approximately $(N-1) \times L$, where N is the number of groups of wordlines (e.g., N=2 in the example illustrated in FIG. 6) and L is the length of the time interval 604 (or 518). Thus, while implementing adaptive wordlines refresh can reduce peak power consumption during refresh operations, a tradeoff can exist between the reduction in peak power consumption and an increase in tRFC, which may increase memory latency. The length of the time interval and the number of groups may be adjusted to manage the tradeoff for particular implementations, based on factors such as the cost and complexity of the local- and device-level power delivery networks. For example, in implementations with a robust power delivery network or in which reducing latency is critical, the logic circuit may be disabled. In other implementations, in which reducing peak power consumption is a primary design consideration the logic circuitry can be enabled, and the number of groups and delay time can be adjusted to provide the desired performance.

Example Methods

Figure 7:
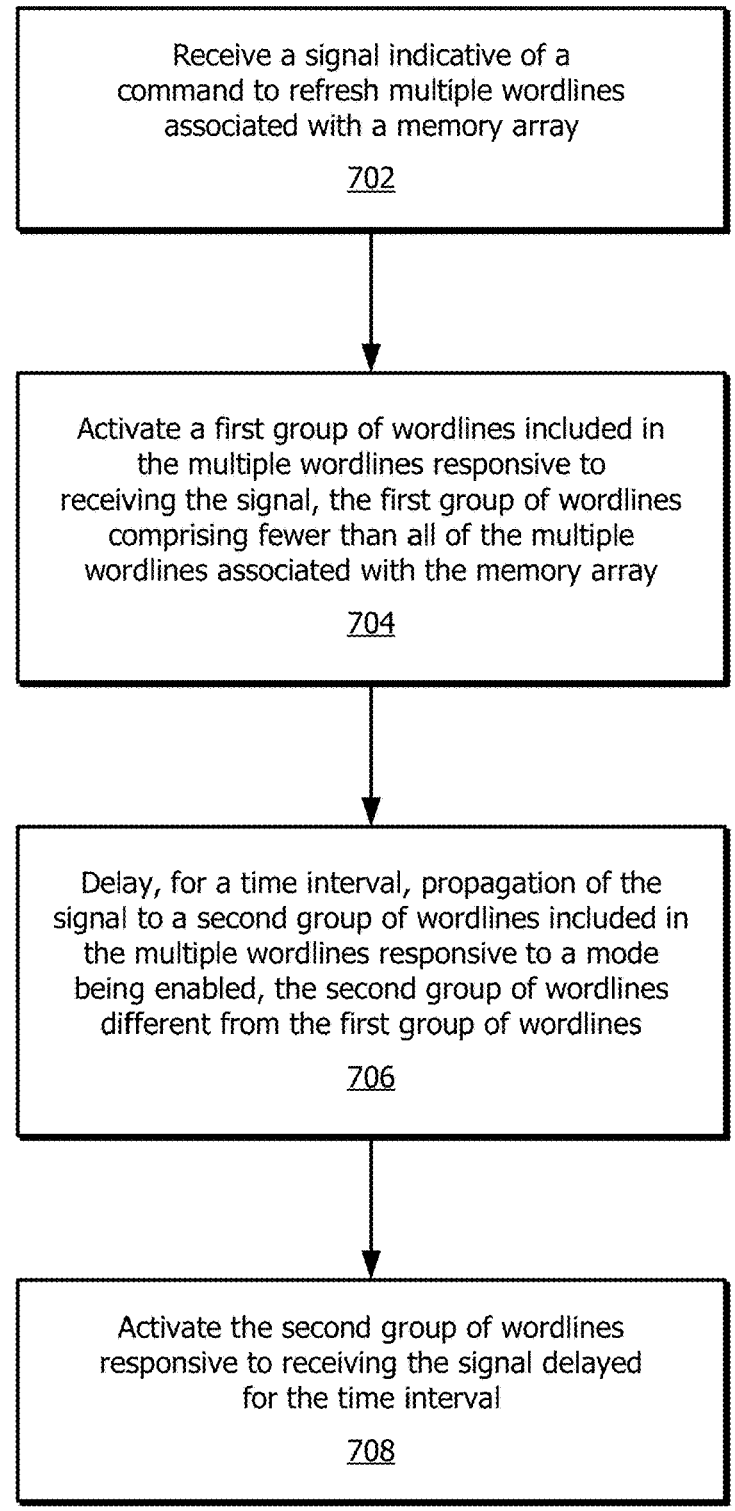
FIG. 7 and FIG. 8 illustrate flow diagrams for example processes that can implement aspects of adaptive wordline refresh.
Figure 8:
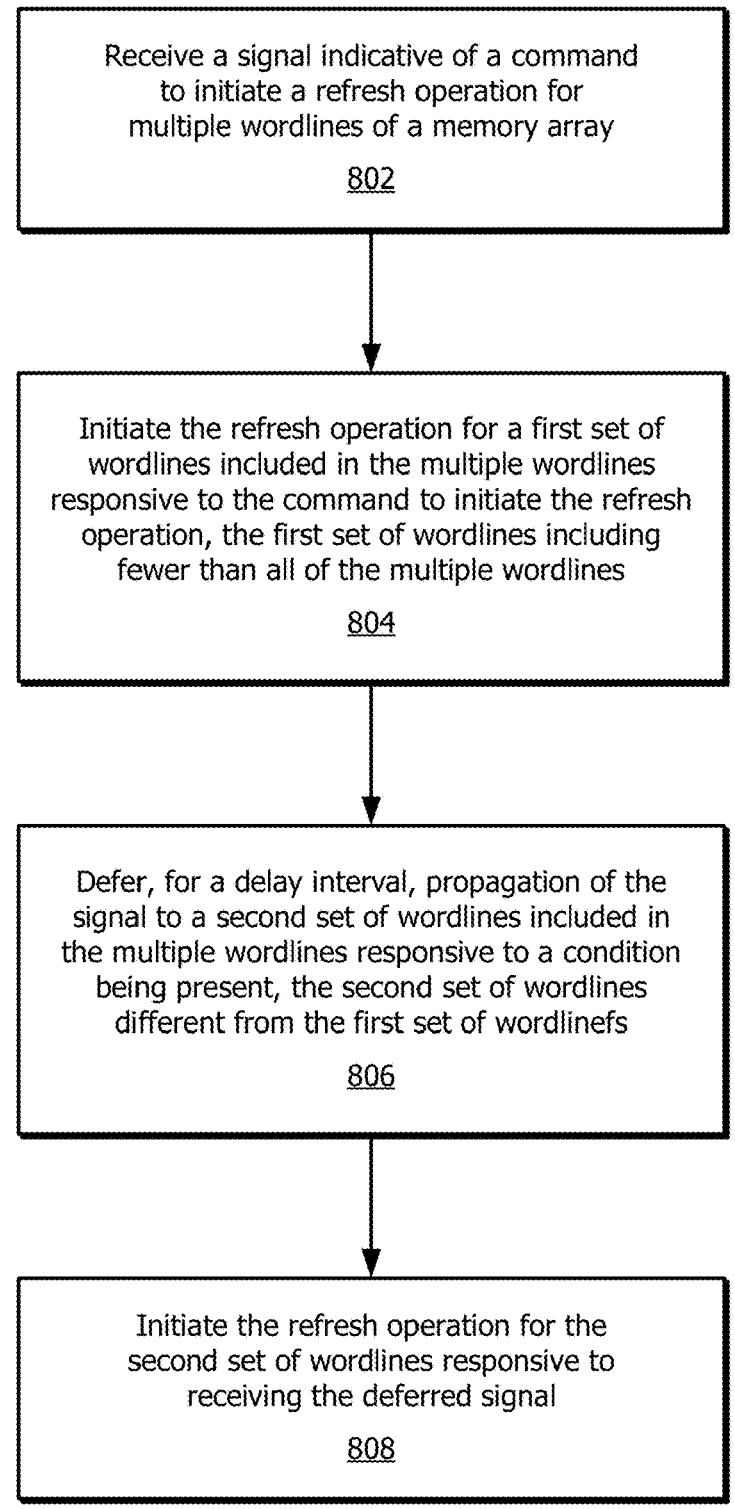

This section describes example methods with reference to the flow chart(s) and flow diagram(s) of FIGS. 7 and 8 for implementing aspects of adaptive wordline refresh. These descriptions may also refer to components, entities, and other aspects depicted in FIGS. 1-6, to which reference is made only by way of example.

FIG. 7 illustrates a flow diagram for example processes 700 that implement aspects of adaptive wordline refresh. At block 702, a signal indicative of a command to activate multiple wordlines associated with a memory array is received. For example, the memory device 108 can receive the activation signal 520 indicative of a command to activate multiple wordlines 510 of the memory array 506. In some cases, the signal may a refresh command or another type of signal indicative of a command to activate multiple wordlines at approximately the same time.

At block 704, a group of wordlines included in the multiple wordlines is activated in response to receiving the signal. The group of wordlines can include fewer than all of the multiple wordlines associated with the memory array. For example, the controller 504 can transmit the activation signal 520-1 to the memory array 506 to activate the eight multiple wordlines 510-1 through 510-8. In response to receiving the activation signal 520-1, the wordlines 510-1 through 510-4 of the first group of wordlines 534 can be activated.

At block 706, propagation of the signal to a second group of wordlines, the second group different from the first group, is delayed for a time interval in response to a mode being enabled. For example, the mode can be a feature to delay activation of at least one wordline of the multiple wordlines. In response to the status of the delay feature being an enabled status, the logic circuit 508-1 can receive the activation signal 520-1 and delay propagation of the activation signal 520-1 for the time interval 518.

At block 708, the second group of wordlines is activated in response to receiving the signal that was delayed for the time interval. For example, the logic circuit 508-1 can transmit the output signal 524-1 to the memory array 506 after the time interval 518. Because in this example the status of the delay feature (e.g., the operational mode) is the enabled status, the output signal 524-1 is the delayed activation signal 522-1. In response to receiving the delayed activation signal 522-1 after the time interval 518, the wordlines 510-5 through 510-8 of the second group of wordlines 536 can be activated. In this way, activation of the wordlines 510-5 through 510-8 (of the second group 536) can be delayed (e.g., staggered) relative to the activation of the wordlines 510-1 through 510-4 (of the first group 534).

In some implementations, when the mode is enabled, propagation of the signal to a third group of wordlines (different from the first and second groups) can be delayed for another time interval. The third group of wordlines can be activated in response to receiving the signal delayed for the other time interval. For example, additional logic circuits 508 can be used to divide the multiple wordlines 510 into more than two groups. As described, in implementations with multiple groups, the length of time the activation signal 520 is delayed (e.g., the time interval 518) may be the same for each logic circuit 508, different for each logic circuit 508, or some intervals may be different and others the same. Further, the multiple groups may contain the same or different quantities of wordlines 510 and the quantity of wordlines activated by the activation signal 520 or the delayed signal(s) 524 may be the same or different for different groups.

FIG. 8 illustrates a flow diagram for other example processes 800 that implement aspects of adaptive wordline refresh. At block 802, a signal indicative of a command to initiate a refresh operation for multiple wordlines of a memory array is received. For example, the memory device 108 can receive a refresh command (e.g., the activation signal 520) indicative of a command to refresh multiple wordlines 510 of the memory array 506. In some cases, the signal may be another command or signal indicative of a command to activate multiple wordlines at approximately the same time.

At block 804, the refresh operation is initiated for a first set of wordlines included in the multiple wordlines, in response to the command to initiate the refresh operation. The first set of wordlines may include fewer than all of the multiple wordlines. For example, the controller 504 can transmit the refresh command (e.g., the activation signal 520) to the memory array 506 to refresh the eight multiple wordlines 510-1 through 510-8. In response to receiving the refresh command, refresh operations for the wordlines 510-1 through 510-4 of the first set of wordlines (e.g., the first group 534) can be initiated.

At block 806, propagation of the signal to a second set of wordlines included in the multiple wordlines, the second set of wordlines different from the first set, is deferred for a delay interval in response to a condition being present. For example, in response to the condition being present, the logic circuit 508-1 can receive the refresh command (e.g., the activation signal 520) and defer propagation of the refresh command for the delay interval. The delay interval may be the time interval 518 or another time period. In some implementations, the condition being present can include receiving (e.g., at the logic circuit 508) an indication that the signal indicative of the command to initiate the refresh operation has been or is being received, and another indication that a feature to defer initiating the refresh operation for at least one wordline is active.

At block 808, the refresh operation for the second set of wordlines is initiated responsive to receiving the deferred signal. For example, the logic circuit 508-1 can transmit the output signal 524-1 to the memory array 506 after the delay interval. Because the condition is present in this example, the output signal 524-1 is the deferred refresh command (e.g., the delayed activation signal 522-1). In response to receiving the deferred refresh command after the delay interval, refresh operations for the wordlines 510-5 through 510-8 of the second set of wordlines (e.g., the second group 536) can be initiated. In this way, refresh operations for the wordlines 510-5 through 510-8 (of the second set) can be delayed (e.g., staggered) relative to the activation of the wordlines 510-1 through 510-4 (of the first set).

In some implementations, when the condition is present, propagation of the signal to a third set of wordlines (different from the first and second sets) can be deferred for another delay interval. The refresh operations for the third set of wordlines can be initiated in response to receiving the refresh command deferred for the other delay interval. For example, additional logic circuits 508 can be used to divide the multiple wordlines 510 into more than two sets (e.g., groups). As described, in implementations with multiple sets, the length of the delay interval (e.g., the time interval 518) may be the same for each logic circuit 508, different for each logic circuit 508, or some delay intervals may be different and others the same. Further, the multiple sets may contain the same or different quantities of wordlines 510 and the quantity of wordlines refreshed by the refresh command or the delayed refresh command may be the same or different for different sets.

The methods 700 and/or 800 can be realized in any number of manners. Consider an example memory system in which the multiple wordlines include at least two nonoverlapping sets of wordlines and the logic circuit 508 includes a multiplexer (e.g., the multiplexer 512) coupled between two adjacent non-overlapping sets of wordlines and a delay unit (e.g., the delay unit 514). The sets of wordlines may include a same or different quantity of wordlines. The signal indicative of the command to initiate a refresh operation for multiple wordlines of a memory array (e.g., the activation signal 520) can be received at an input of the multiplexer, and the deferred signal (e.g., the delayed activation signal 522-1) can be received from the delay unit at another input of the multiplexer.

The deferred signal may be received in response to another signal received at a third input of the multiplexer (e.g., from the gate logic 516). The other signal may be indicative of the condition being present. For example, the other signal can include an indication that the multiplexer received the signal indicative of the command to initiate the refresh operation and another indication that a feature to delay initiating the refresh operation for at least one wordline is active (e.g., the other signal can be the mode-enable signal 526). The indication that the multiplexer received the signal indicative of the command to initiate the refresh operation and the indication that the feature to defer initiating the refresh operation for at least one wordline is active may be based on one or more bits stored using a register or a fuse (e.g., a mode register or a test-mode fuse).

The methods 700 and/or 800 can be used to reduce peak power consumption during refresh operations. For example, consider an implementation in which the multiple wordlines (e.g., the multiple wordlines 510) include at least two nonoverlapping sets of wordlines, and initiation of refresh operations for the at least two sets of nonoverlapping wordlines can be temporally staggered by deferring propagation of the signal between the at least two sets of nonoverlapping wordlines, using one or more delay intervals, as described. Deferring propagation of the signal can reduce peak power consumption during the refresh operations. For example, as described above, simultaneous or near-simultaneous activation of multiple wordlines consumes a relatively large amount of power and can increase or cause a peak in power consumption.

Staggering the refresh operations can therefore reduce the peak power consumption, relative to not staggering the operations, because activation of a set or subset of the wordlines that are to be activated or refreshed by a particular signal or command can reduce peak power consumption, although it may also introduce a time penalty, such as an increase in refresh cycle time. Thus, while implementing adaptive wordlines refresh can reduce peak power consumption during refresh operations, there may be a tradeoff between the reduction in peak power consumption and a possible increase in latency (e.g., as described with reference to FIG. 6).

For the flow chart(s) and flow diagram(s) described above, the orders in which operations are shown and/or described are not intended to be construed as a limitation. Any number or combination of the described process operations can be combined or rearranged in any order to implement a given method or an alternative method. Operations may also be omitted from or added to the described methods. Further, described operations can be implemented in fully or partially overlapping manners.

Aspects of these methods may be implemented in, for example, hardware (e.g., fixed-logic circuitry or a processor in conjunction with a memory), firmware, software, or some combination thereof. The methods may be realized using one or more of the apparatuses, components, or other aspects shown in FIGS. 1 to 6, the components or aspects of which may be further divided, combined, rearranged, and so on. The devices and components of these figures generally represent hardware, such as electronic devices, packaged modules, IC chips, or circuits; firmware or the actions thereof; software; or a combination thereof. Thus, these figures illustrate some of the many possible systems or apparatuses capable of implementing the described methods.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

Conclusion

Although implementations for adaptive wordline refresh have been described in language specific to certain features and/or methods, the subject of the appended claims is not necessarily limited to the specific features or methods described. Rather, the specific features and methods are disclosed as example implementations for response-based interconnect control.

What is claimed is:

1. An apparatus comprising:
a memory array including contiguous memory cells coupled to multiple wordlines; and
a logic circuit coupled to the multiple wordlines of the memory array, the logic circuit configured to:
receive a first signal indicative of a command to activate at least two wordlines of the multiple wordlines; and
delay propagation of the first signal for a time interval based on a second signal indicative of an operational mode.

2. The apparatus of claim 1, wherein:
the logic circuit is coupled between a first group of wordlines of the multiple wordlines and a second group of wordlines of the multiple wordlines; and
the first signal is further indicative of a command to activate at least one wordline in the first group and at least one wordline in the second group.

3. The apparatus of claim 2, wherein each of the first group of wordlines and the second group of wordlines has a same quantity of wordlines.

4. The apparatus of claim 2, wherein the first group of wordlines and the second group of wordlines have different quantities of wordlines.

5. The apparatus of claim 1, wherein the logic circuit comprises:
a delay unit configured to delay the propagation of the first signal for the time interval to produce a delayed signal; and
a multiplexer configured to receive:
the first signal indicative of the command to activate the at least two wordlines of the multiple wordlines;
the delayed signal; and
the second signal indicative of the operational mode.

6. The apparatus of claim 5, wherein the delay unit is further configured to determine a duration of the time interval based on a third signal.

7. The apparatus of claim 6, wherein the third signal is based on at least one bit that is stored using a register or a fuse.

8. The apparatus of claim 5, wherein:
the operational mode comprises a feature to delay activation of at least one wordline of the multiple wordlines; and
the second signal is based on:
a fourth signal indicating that the logic circuit received the first signal indicative of the command to activate the at least two wordlines of the multiple wordlines; and
a fifth signal indicating a status of the feature to delay activation of at least one wordline.

9. The apparatus of claim 8, wherein the fourth signal is based on at least one bit that is stored using a first register or a first fuse.

10. The apparatus of claim 9, wherein the fifth signal indicating the status of the feature to delay activation of at least one wordline is based on at least one bit that is stored using a second register or a second fuse.

11. The apparatus of claim 8, further comprising:
a logical gate configured to provide the second signal to the multiplexer.

12. The apparatus of claim 8, wherein the multiplexer is further configured to transmit the delayed signal responsive to:
receiving the first signal; and
the second signal indicating that the logic circuit received the first signal and that the status of the feature to delay activation of at least one wordline comprises an enabled status.

13. The apparatus of claim 8, wherein the multiplexer is further configured to transmit the first signal responsive to:
receiving the first signal; and
the second signal indicating that the status of the feature to delay activation of at least one wordline comprises a not-enabled status.

14. The apparatus of claim 1, further comprising:
an interface configured to couple to a host device via an interconnect; and
a link controller configured to be coupled to the interface, the link controller configured to communicate with the host device.

15. The apparatus of claim 14, wherein the interconnect is configured to comport with at least one Compute Express Link (CXL) standard.

16. The apparatus of claim 14, wherein the apparatus comprises a Compute Express Link (CXL) device.

17. The apparatus of claim 1, wherein the contiguous memory cells form at least part of a bank of the memory array.

18. The apparatus of claim 1, wherein the command is related to a refresh operation.

19. A method comprising:
receiving a signal indicative of a command to activate multiple wordlines coupled to contiguous memory cells of a memory array;
activating a first group of wordlines included in the multiple wordlines responsive to receiving the signal, the first group of wordlines comprising fewer than all of the multiple wordlines associated with the memory array;
delaying, for a time interval, propagation of the signal to a second group of wordlines included in the multiple wordlines responsive to a mode being enabled, the second group of wordlines different from the first group of wordlines; and
activating the second group of wordlines responsive to receiving the signal delayed for the time interval.

20. The method of claim 19, further comprising:
delaying, for another time interval, propagation of the signal to a third group of wordlines included in the multiple wordlines responsive to the mode being enabled, the third group of wordlines different from the first group of wordlines and the second group of wordlines; and
activating the third group of wordlines responsive to receiving the signal delayed for the other time interval.

21. The method of claim 20, wherein the time interval and the other time interval are a same length of time.

22. The method of claim 20, wherein the time interval and the other time interval are different lengths of time.

23. The method of claim 19, wherein the multiple wordlines are configured to activate memory cells on corresponding rows of the memory array.

24. The method of claim 23, wherein the multiple wordlines are configured to activate the memory cells on the corresponding rows of the memory array responsive to at least one refresh operation targeting the corresponding rows.

25. A method comprising:
receiving a signal indicative of a command to initiate a refresh operation for multiple wordlines coupled to contiguous memory cells of a memory array;
initiating the refresh operation for a first set of wordlines included in the multiple wordlines responsive to the command to initiate the refresh operation, the first set of wordlines including fewer than all of the multiple wordlines;
deferring, for a delay interval, propagation of the signal to produce a deferred signal for a second set of wordlines included in the multiple wordlines responsive to a condition being present, the second set of wordlines different from the first set of wordlines; and
initiating the refresh operation for the second set of wordlines responsive to receiving the deferred signal.

26. The method of claim 25, wherein the condition being present comprises receiving:
an indication of reception of the signal indicative of the command to initiate the refresh operation; and
another indication that a feature to defer initiating the refresh operation for at least one wordline is active.

27. The method of claim 25, further comprising:
deferring, for another delay interval, propagation of the signal to a third set of wordlines included in the multiple wordlines responsive to the condition being present, the third set of wordlines different from the first set of wordlines and the second set of wordlines; and
initiating the refresh operation for the third set of wordlines responsive to receiving the deferred signal after the delay interval and the other delay interval.

28. The method of claim 27, wherein the delay interval and the other delay interval are a same amount of time.

29. The method of claim 27, wherein the delay interval and the other delay interval are different amounts of time.

30. The method of claim 25, wherein the multiple wordlines further comprise at least two nonoverlapping sets of wordlines, and the method further comprises:
temporally staggering, using one or more other delay intervals, initiation of the refresh operation for the at least two nonoverlapping sets of wordlines.

31. The method of claim 25, wherein the multiple wordlines further comprise at least two nonoverlapping sets of wordlines, and the method further comprises:
reducing a peak power consumption during the refresh operation for the multiple wordlines of the memory array by deferring propagation of the signal between the at least two nonoverlapping sets of wordlines.

32. The method of claim 25, wherein:
the multiple wordlines further comprise at least two nonoverlapping sets of wordlines;
the signal indicative of the command to initiate the refresh operation for the multiple wordlines is received at a first input of a multiplexer coupled between two adjacent nonoverlapping sets of the at least two nonoverlapping sets of wordlines;
the deferred signal is received at a second input of the multiplexer, the deferred signal received from a delay unit responsive to receiving, at a third input of the multiplexer, another signal, the other signal indicative of the condition being present and comprising:
an indication that the multiplexer received the signal indicative of the command to initiate the refresh operation; and
another indication that a feature to delay initiating the refresh operation for at least one wordline is active.

33. The method of claim 32, wherein the indication that the multiplexer received the signal indicative of the command to initiate the refresh operation is based on at least one bit that is stored using a register or a fuse.

34. The method of claim 32, wherein the other indication that a feature to defer initiating the refresh operation for at least one wordline is active is based on at least one bit that is stored using a register or a fuse.

35. The method of claim 25, wherein each of the first set of wordlines and the second set of wordlines has a same quantity of wordlines.

36. The method of claim 25, wherein the first set of wordlines and the second set of wordlines have different quantities of wordlines.

\* \* \* \* \*